US011747951B2

(12) United States Patent
Chen

(10) Patent No.: US 11,747,951 B2
(45) Date of Patent: Sep. 5, 2023

(54) ELECTROMAGNETIC INDUCTION FILM AND MANUFACTURING METHOD THEREOF, AND METHOD FOR MANUFACTURING AN ELECTROMAGNETIC INDUCTION PANEL

(71) Applicant: Shenzhen Hitevision Technology Co., Ltd., Guangdong (CN)

(72) Inventor: Yunshen Chen, Guangdong (CN)

(73) Assignee: SHENZHEN HITEVISION TECHNOLOGY CO., LTD., Shenzhen (CN)

( * ) Notice: Subject to any disclaimer, the term of this patent is extended or adjusted under 35 U.S.C. 154(b) by 399 days.

(21) Appl. No.: 17/008,149

(22) Filed: Aug. 31, 2020

(65) Prior Publication Data

US 2021/0223891 A1    Jul. 22, 2021

(30) Foreign Application Priority Data

Jan. 19, 2020 (CN) .......................... 202010060087.7

(51) Int. Cl.
*H01F 7/06* (2006.01)
*G06F 3/046* (2006.01)
(Continued)

(52) U.S. Cl.
CPC ............ *G06F 3/046* (2013.01); *G06F 3/0412* (2013.01); *H01F 5/02* (2013.01); *H01F 27/28* (2013.01);
(Continued)

(58) Field of Classification Search
CPC ................... G06F 3/0412; G06F 3/046; G06F 2203/04103; H01F 41/041; H01F 41/042;
(Continued)

(56) References Cited

U.S. PATENT DOCUMENTS 6,002,593 A * 12/1999 Tohya .................... H05K 1/165
336/200
6,976,300 B2 * 12/2005 Ahn .................... H01F 17/0033
29/605

(Continued)

FOREIGN PATENT DOCUMENTS

CN    203084702 U    7/2013

*Primary Examiner* — Paul D Kim
(74) *Attorney, Agent, or Firm* — East IP P.C.

(57) ABSTRACT

The present disclosure relates to an electromagnetic induction film and a manufacturing method thereof, an electromagnetic induction panel and a manufacturing method thereof, and a touch display device. The method for manufacturing the electromagnetic induction film may include: arranging a plurality of first conductors in parallel along and spaced apart along a first direction on a substrate; arranging an insulating layer on the plurality of first conductors; arranging a plurality of second conductors in parallel and spaced apart along the first direction on the insulating layer; and electrically connecting head end areas of the first conductors to head end areas of the second conductors and electrically connecting tail end areas of the first conductors to tail end areas of the second conductors to form an electromagnetic induction coil spirally surrounding the insulating layer.

8 Claims, 7 Drawing Sheets

(51) Int. Cl.
*G06F 3/041* (2006.01)
*H01F 5/02* (2006.01)
*H01F 27/28* (2006.01)
*H01F 41/04* (2006.01)
H01F 5/00 (2006.01)
H01F 27/00 (2006.01)
H01L 49/02 (2006.01)

(52) U.S. Cl.
CPC . *H01F 41/041* (2013.01); *G06F 2203/04103* (2013.01); *H01F 5/003* (2013.01); *H01F 27/00* (2013.01); *H01L 28/10* (2013.01)

(58) Field of Classification Search
CPC ........ H01F 17/0013; H01F 5/003; H01F 5/02; H01F 27/00; H01F 27/28; H01F 2017/004; H01L 28/10
See application file for complete search history.

(56) References Cited

U.S. PATENT DOCUMENTS 7,176,772 B2 * 2/2007 Maeda ................ H01F 17/0013
336/200
7,498,919 B2 * 3/2009 Fujiwara ............. H01F 17/0033
336/200

* cited by examiner

S101 — arranging a plurality of first conductors in parallel and spaced apart along a first direction on a first substrate; arranging a first insulating layer on the plurality of first conductors, wherein a head end area and a tail end area of each of the first conductors extend out of the first insulating layer; arranging a plurality of second conductors in parallel and spaced apart along the first direction on the first insulating layer, wherein a head end area and a tail end area of each of the second conductors extend out of the first insulating layer; and electrically connecting head end areas of the first conductors to head end areas of the second conductors and electrically connecting tail end areas of the first conductors to tail end areas of the second conductors to form an first electromagnetic induction coil spirally surrounding the first insulating layer, so as to obtain a first electromagnetic induction film S102 — arranging a plurality of third conductors in parallel and spaced apart along a second direction on a second substrate; arranging a second insulating layer on the plurality of third conductors, wherein a head end area and a tail end area of each of the third conductors extend out of the second insulating layer; arranging a plurality of fourth conductors in parallel and spaced apart along the second direction on the second insulating layer, wherein a head end area and a tail end area of each of the fourth conductors extend out of the second insulating layer; and electrically connecting head end areas of the third conductors to head end areas of the fourth conductors and electrically connecting tail end areas of the third conductors to tail end areas of the fourth conductors to form an second electromagnetic induction coil spirally surrounding the second insulating layer, so as to obtain a second electromagnetic induction film S103 — bonding the first electromagnetic induction film and the second electromagnetic induction film S104 — bonding the bonded first electromagnetic induction film and second electromagnetic induction film to a glass cover plate to obtain the electromagnetic induction panel

Fig. 13

ELECTROMAGNETIC INDUCTION FILM AND MANUFACTURING METHOD THEREOF, AND METHOD FOR MANUFACTURING AN ELECTROMAGNETIC INDUCTION PANEL

CROSS-REFERENCE TO RELATED APPLICATION

The present application claims priority to Chinese Patent Application No. 202010060087.7 filed on Jan. 19, 2020, which is incorporated herein by reference in its entirety.

TECHNICAL FIELD

The present disclosure relates to the technical field of touch technology, and in particular relates to an electromagnetic induction film and a manufacturing method thereof, an electromagnetic induction panel and a manufacturing method thereof, and a touch display device.

BACKGROUND

Electromagnetic induction panels are commonly used touch panels now. A touch principle of the electromagnetic induction panels may be identifying a touch position and a sliding operation of an electromagnetic pen on an electromagnetic induction panel according to a change of a magnetic field generated by the electromagnetic induction panel during a process of operating the electromagnetic induction panel through the electromagnetic pen. The electromagnetic induction panel may generally include an upper electromagnetic induction film and a lower electromagnetic induction film, and the induction of touch points may be realized through the electromagnetic induction films.

In the prior art, a method for manufacturing the electromagnetic induction film may include: manufacturing a part of an electromagnetic induction loop on two sides of a substrate, providing vias at both ends of the electromagnetic induction loop, and then filling the vias with conductive materials to connect the electromagnetic induction loop on the two sides of the substrate, thereby conducting the electromagnetic induction loop on the two sides of the substrate and forming an induction coil. However, the manufacturing processes are complex.

SUMMARY

A first aspect of the embodiments of the present disclosure provides a method for manufacturing an electromagnetic induction film, including: arranging a plurality of first conductors in parallel and spaced apart along a first direction on a substrate; arranging an insulating layer on the plurality of first conductors, wherein a head end area and a tail end area of each of the first conductors may extend out of the insulating layer; arranging a plurality of second conductors in parallel and spaced apart along the first direction on the insulating layer, wherein a head end area and a tail end area of each of the second conductors may extend out of the insulating layer; and electrically connecting head end areas of the first conductors to head end areas of the second conductors, and electrically connecting tail end areas of the first conductors to tail end areas of the second conductors, to form an electromagnetic induction coil spirally surrounding the insulating layer.

A second aspect of the embodiments of the present disclosure provides a method for manufacturing an electromagnetic induction panel, including: arranging a plurality of first conductors in parallel and spaced apart along a first direction on a first substrate; arranging a first insulating layer on the plurality of first conductors, wherein a head end area and a tail end area of each of the first conductors may extend out of the first insulating layer; arranging a plurality of second conductors in parallel and spaced apart along the first direction on the first insulating layer, wherein a head end area and a tail end area of each of the second conductors may extend out of the first insulating layer; and electrically connecting head end areas of the first conductors to head end areas of the second conductors and electrically connecting tail end areas of the first conductors to tail end areas of the second conductors to form an first electromagnetic induction coil spirally surrounding the first insulating layer, so as to obtain a first electromagnetic induction film; arranging a plurality of third conductors in parallel and spaced apart along a second direction on a second substrate; arranging a second insulating layer on the plurality of third conductors, wherein a head end area and a tail end area of each of the third conductors may extend out of the second insulating layer; arranging a plurality of fourth conductors in parallel and spaced apart along the second direction on the second insulating layer, wherein a head end area and a tail end area of each of the fourth conductors may extend out of the second insulating layer; and electrically connecting head end areas of the third conductors to head end areas of the fourth conductors and electrically connecting tail end areas of the third conductors to tail end areas of the fourth conductors to form an second electromagnetic induction coil spirally surrounding the second insulating layer, so as to obtain a second electromagnetic induction film; bonding the first electromagnetic induction film and the second electromagnetic induction film; and bonding the bonded first electromagnetic induction film and second electromagnetic induction film to a glass cover plate to obtain the electromagnetic induction panel.

A third aspect of the embodiments of the present disclosure provides an electromagnetic induction film, including a substrate and a plurality of electromagnetic induction units; wherein each of the electromagnetic induction units may include a plurality of first conductors, an insulating layer, and a plurality of second conductors in sequence, the plurality of first conductors may be arranged in parallel and spaced apart along a first direction on the substrate, the plurality of second conductors may be arranged in parallel and spaced apart along the first direction on the insulating layer, a head end area and a tail end area of each of the first conductors may extend out of the insulating layer, a head end area and a tail end area of each of the second conductors may extend out of the insulating layer, and head end areas of the first conductors and head end areas of the second conductors may be electrically connected and tail end areas of the first conductors and tail end areas of the second conductors may be electrically connected to form an electromagnetic induction coil spirally surrounding the insulating layer.

A fourth aspect of the embodiments of the present disclosure provides an electromagnetic induction panel, including a glass cover plate, a first electromagnetic induction film and a second electromagnetic induction film in sequence, wherein the first electromagnetic induction film may include a first substrate and a plurality of first electromagnetic induction units, the second electromagnetic induction film may include a second substrate and a plurality of second electromagnetic induction units; wherein each of the first electromagnetic induction units may include a plurality of first conductors, a first insulating layer, and a plurality of second conductors in sequence, the plurality of first conductors may be arranged in parallel and spaced apart along a first direction on the first substrate, the plurality of second conductors may be arranged in parallel and spaced apart along the first direction on the first insulating layer, a head end area and a tail end area of each of the first conductors may extend out of the first insulating layer, a head end area and a tail end area of each of the second conductors may extend out of the first insulating layer, and head end areas of the first conductors and head end areas of the second conductors may be electrically connected and tail end areas of the first conductors and tail end areas of the second conductors may be electrically connected to form an first electromagnetic induction coil spirally surrounding the first insulating layer; and wherein each of the second electromagnetic induction units may include a plurality of third conductors, a second insulating layer, and a plurality of fourth conductors in sequence, the plurality of third conductors may be arranged in parallel and spaced apart along a second direction on the second substrate, the plurality of fourth conductors may be arranged in parallel and spaced apart along the second direction on the second insulating layer, a head end area and a tail end area of each of the third conductors may extend out of the second insulating layer, a head end area and a tail end area of each of the fourth conductors may extend out of the second insulating layer, and head end areas of the third conductors and head end areas of the fourth conductors may be electrically connected and tail end areas of the third conductors and tail end areas of the fourth conductors may be electrically connected to form an second electromagnetic induction coil spirally surrounding the second insulating layer, wherein an orthographic projection of the second electromagnetic induction coil on the first substrate may intersect the first electromagnetic induction coil.

A fifth aspect of the embodiments of the present disclosure provides a touch display device, including a display screen and the electromagnetic induction panel in the fourth aspect, wherein the electromagnetic induction panel may be arranged at a front end of the display screen.

BRIEF DESCRIPTION OF THE DRAWINGS

In order to illustrate the technical solution in the embodiments of the present disclosure more clearly, the drawings which are used in the description of the embodiments or the prior art will be briefly introduced below. Obviously, the drawings described below are only some embodiments of the present disclosure. For the skilled in the field, other drawings can be obtained according to these drawings without creative labor.

FIG. 13 is a schematic flowchart of a method for manufacturing an electromagnetic induction panel provided by an embodiment of the present disclosure;

DETAILED DESCRIPTION

In the following description, for the purpose of illustration rather than limitation, specific details such as a specific system structure and technology are proposed for a thorough understanding of the embodiments of the present disclosure. However, it should be clear to those skilled in the art that the present disclosure can also be implemented in other embodiments without these specific details. In other cases, detailed descriptions of well-known structures and steps are omitted to avoid unnecessary details from obstructing the description of the present disclosure.

It should be noted that the term "comprise" and any variations thereof in the description and claims of the present disclosure are intended to cover non-exclusive inclusions. Examples include systems, products, or steps that are not listed.

The reference to "one embodiment" or "some embodiments" described in the description of the present disclosure means that one or more embodiments of the present disclosure include a specific feature, structure, or characteristic described in combination with the embodiment. Therefore, the phrases "in one embodiment", "in some embodiments", "in some other embodiments", "in some further embodiments", etc. appearing in different places in the description are not necessarily all refer to the same embodiment, but mean "one or more but not all embodiments", unless otherwise specifically emphasized. The terms "comprise", "include", "have" and their variations all mean "including but not limited to", unless otherwise specifically emphasized.

Embodiment One

Figure 1:
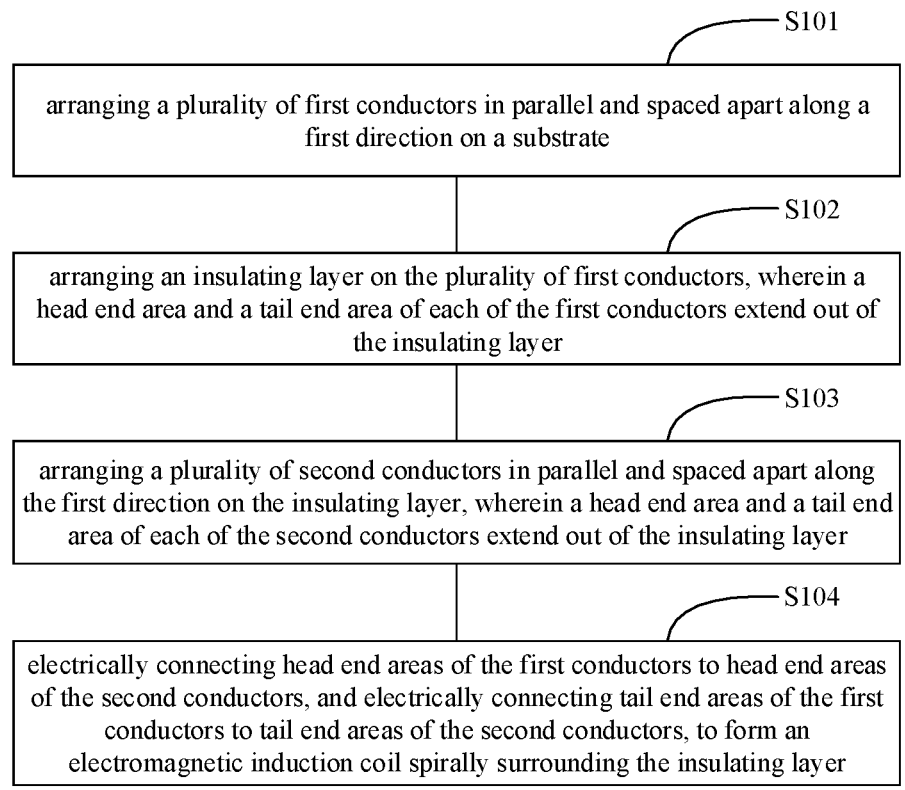
FIG. 1 is a schematic flow chart of a method for manufacturing an electromagnetic induction film provided by an embodiment of the present disclosure.

As shown in FIG. 1, this embodiment provides a method for manufacturing an electromagnetic induction film, including the following steps.

S101, a plurality of first conductors may be arranged in parallel and spaced apart along a first direction on a substrate.

In application, the substrate may be a polyethylene terephthalate (PET) film, a polyimide (PI) film, or a cyclic olefin polymer (COP) film, etc. The size of the substrate may be set according to actual needs, and there is no limitation here.

In application, the first conductors may include materials of nano indium tin oxides (ITO), conductive glasses, nano silver wires or metal grids.

Figure 2:
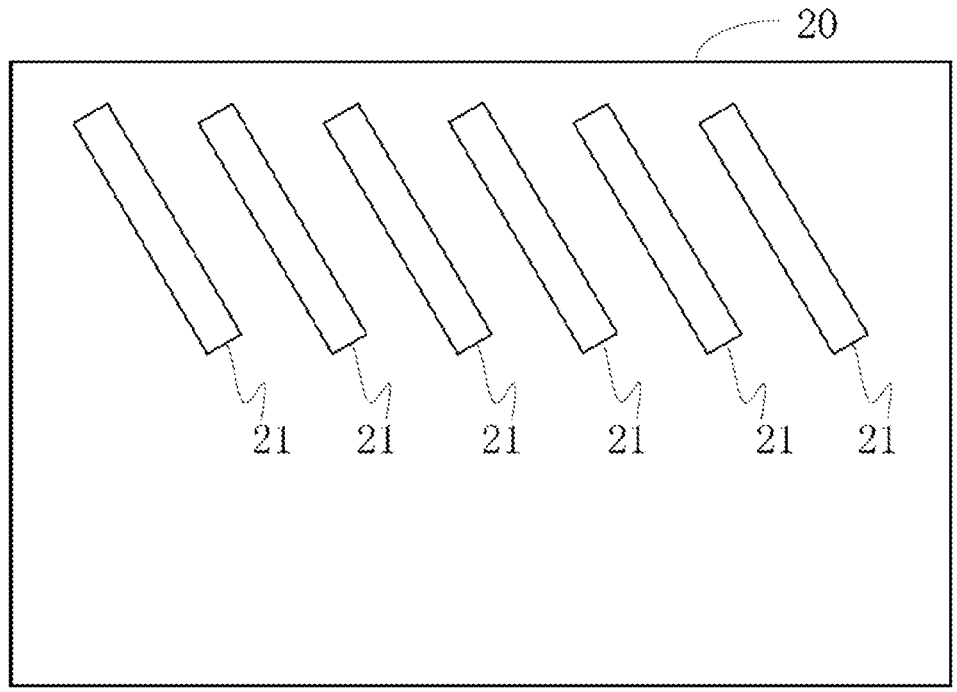
FIG. 2 is a first schematic structural diagram of a first conductor provided by an embodiment of the present disclosure.
Figure 3:
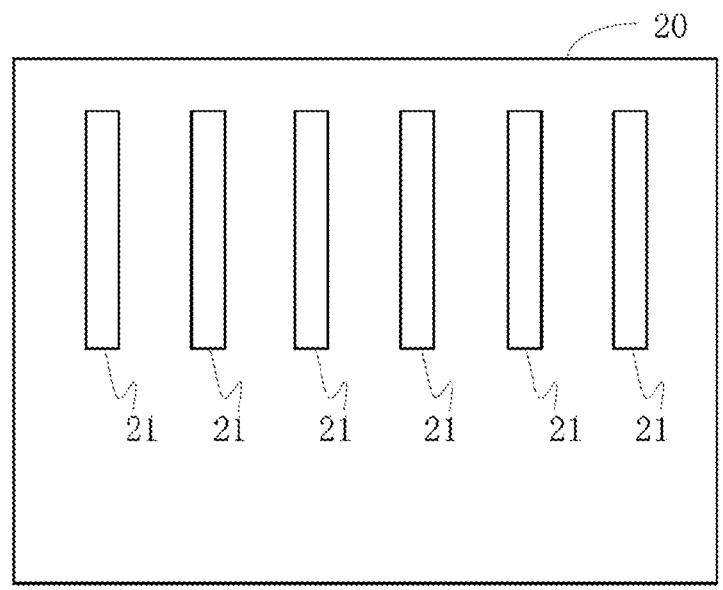
FIG. 3 is a second schematic structural diagram of the first conductor provided by an embodiment of the present disclosure.
Figure 4:
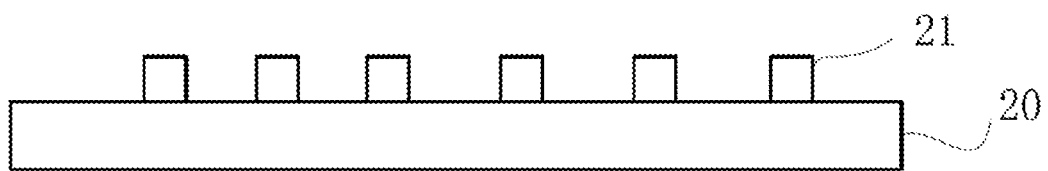
FIG. 4 is a third schematic structural diagram of the first conductor provided by an embodiment of the present disclosure.

In application, referring to FIGS. 2, 3 and 4, the first conductors 21 are arranged in parallel and spaced apart on the substrate 20, and adjacent first conductors 21 may have the same spacing. The first direction may be a length direction or a width direction of the substrate 20, and the plurality of first conductors 21 may be arranged along the length direction of the substrate 20. In this embodiment, the first direction may be the length direction of the substrate 20 as an example.

In application, the first conductor 21 may have any shape. In this embodiment, the first conductor 21 may be a long strip as an example.

In one embodiment, the step of arranging the plurality of first conductors in parallel and spaced apart on the substrate may include: arranging a first thin film 50 on the substrate 20; and removing a grid area 51 of the first thin film 50 to obtain the plurality of first conductors 21 arranged in parallel and spaced apart on the substrate 20; wherein a distance between adjacent grids 52 in the grid area in the first direction may be equal to a distance between two adjacent first conductors 21.

In application, the first thin film may be a nano indium tin oxide thin film or a metal thin film.

Figure 5:
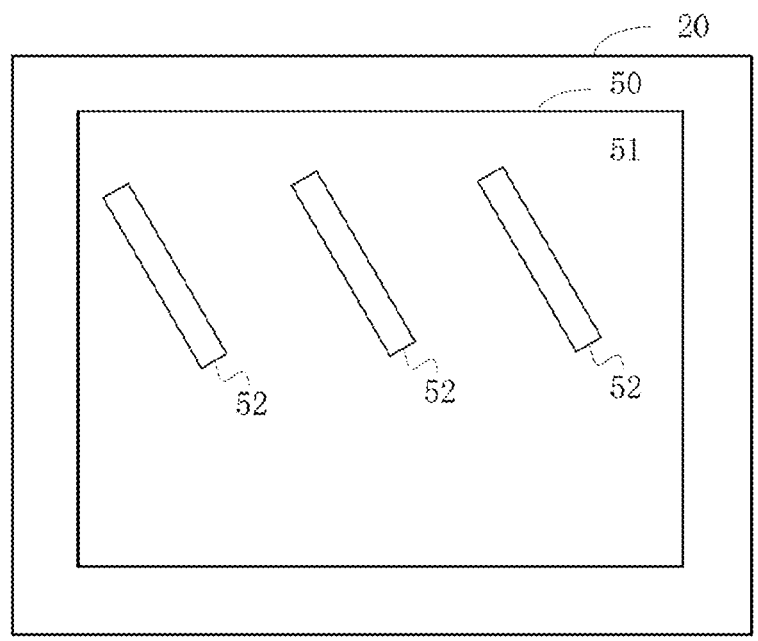
FIG. 5 is a schematic structural diagram of a first thin film provided by an embodiment of the present disclosure.

It can be understood that, as shown in FIG. 5, the grid area 51 of the first thin film 50 may be the area outside the first conductors on the first film 50, and the grids 52 in the grid area 51 may be the remaining portion after the grid area of the first thin film is removed, that is the area of the first conductors 21 that needs to be reserved. After the grid area 51 is removed, the plurality of first conductors 21 arranged on the substrate 20 may be obtained.

In one embodiment, the grid area of the first thin film may be removed by laser technology to obtain the plurality of first conductors 21 arranged in parallel and spaced apart on the substrate 20.

S102, an insulating layer may be arranged on the plurality of first conductors, wherein a head end area and a tail end area of each of the first conductors may extend out of the insulating layer;

In application, the insulating layer may include materials of insulating ink.

In application, a thickness of the insulating layer may be greater than or equal to 10 μm, and may be set according to actual needs, and specifically may be any thickness from 10 μm to 20 μm.

In one embodiment, the insulating layer may be printed on the middle areas of the plurality of first conductors; wherein a length of the insulating layer in the first direction may be greater than a length of the plurality of first conductors in the first direction.

In application, the insulating layer may be printed on the first conductors 21 and the substrate 20 by screen printing technology.

Figure 6:
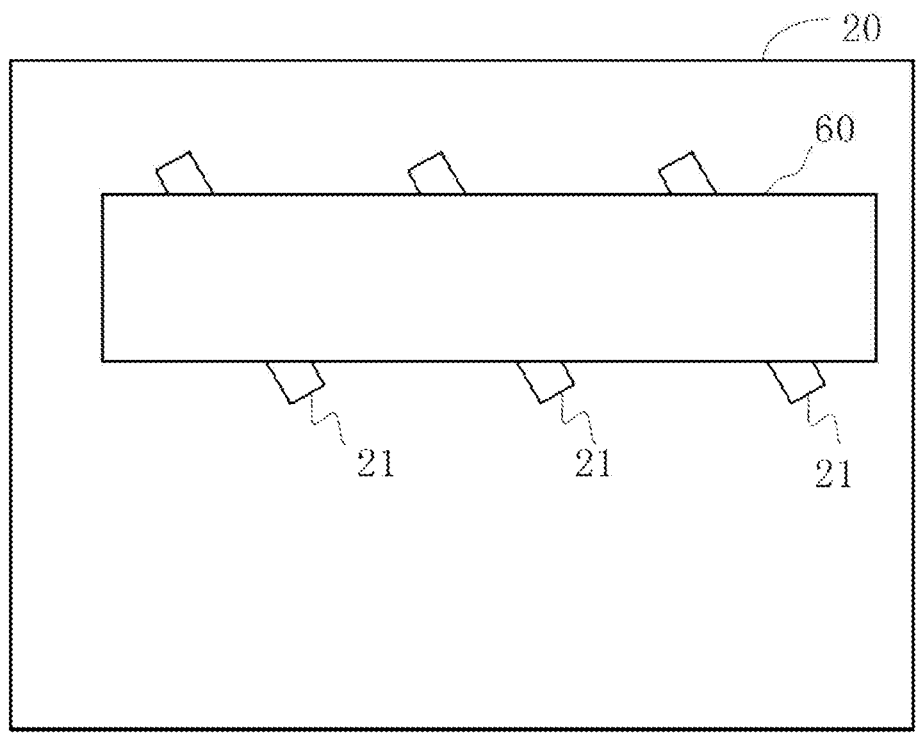
FIG. 6 is a first schematic structural diagram of an insulating layer provided by an embodiment of the present disclosure.
Figure 7:
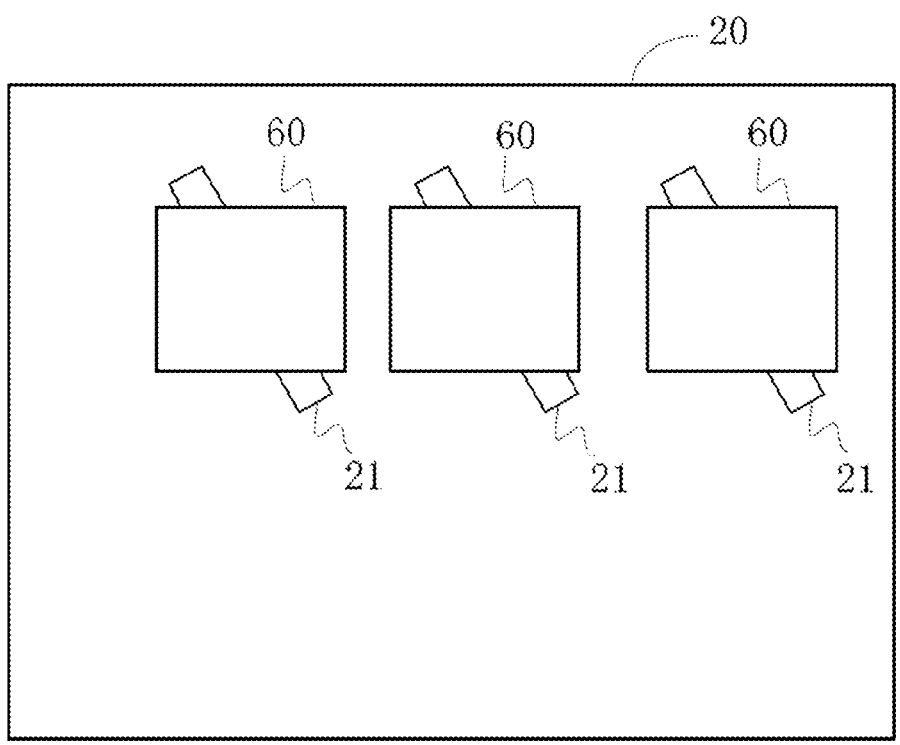
FIG. 7 is a second schematic structural diagram of the insulating layer provided by an embodiment of the present disclosure.

It can be understandable that, as shown in FIGS. 6 and 7, the insulating layer 60 may be continuous or discontinuous in the first direction, and the length of the insulating layer 60 in the first direction may be greater than the length of the first conductors 21 in the first direction, that is, the insulating layer 60 may cover the middle areas of the first conductors 21.

It can be understood that head end areas and tail end areas of the first conductors 21 may not be covered by the insulating layer 60, and the size of the head end areas, the middle areas and the tail end areas of the first conductors 21 may be adjusted according to actual needs, which is not limited here.

In one embodiment, a layer of insulating ink may be printed on the middle areas of the plurality of first conductors 21, and the insulating ink may be cured to obtain the insulating layer 60.

In application, the curing treatment may be a curing process of the insulating ink, such as a thermal curing by using an oven, or a light curing by using an ultraviolet lamp.

S103, a plurality of second conductors may be arranged in parallel and spaced apart along the first direction on the insulating layer.

In application, the second conductors may include materials of a metallic ink, such as a silver glue and a copper glue. The metallic ink may be a conductive ink, and the conductive ink may be used to print conductive dots and conductive circuits.

In one embodiment, a layer of metallic ink may be printed on the insulating layer to obtain a plurality of second conductors arranged in parallel and spaced apart along the first direction.

In application, the first direction may be the length direction of the substrate 20, and the plurality of second conductors may be arranged along the length direction of the substrate 20.

In application, the second conductor may have any shape. In this embodiment, an orthographic projection of the second conductor on the substrate 20 may be a long strip as an example, and distances between two adjacent second conductors may be equal.

Figure 8:
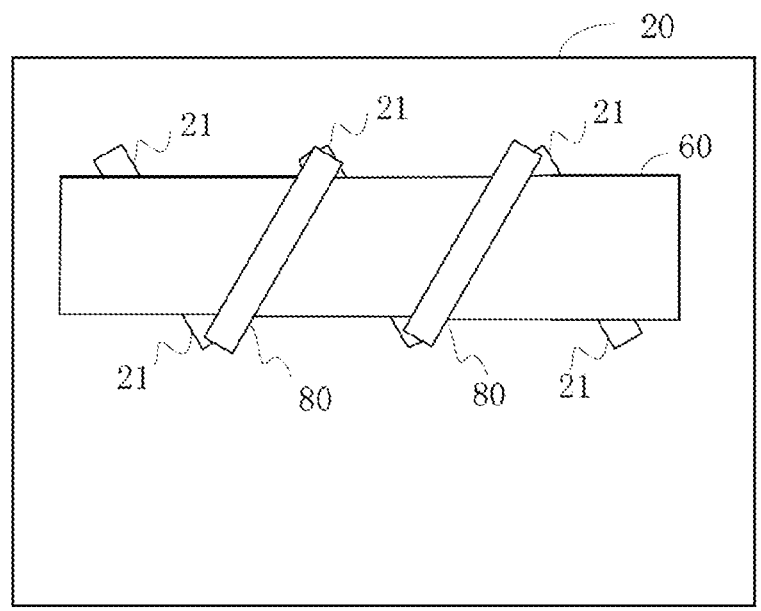
FIG. 8 is a first schematic structural diagram of a second conductor provided by an embodiment of the present disclosure.
Figure 9:
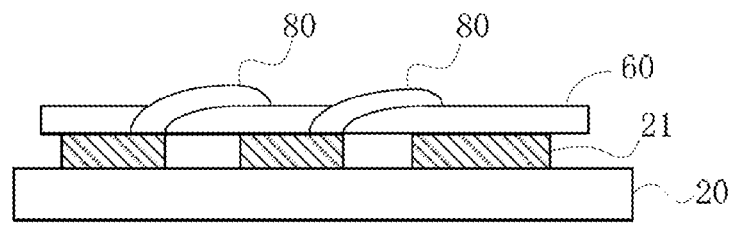
FIG. 9 is a second schematic structural diagram of the second conductor provided by an embodiment of the present disclosure

In application, as shown in FIGS. 8 and 9, middle areas of the second conductors 80 may be arranged on the insulating layer 60, and head end areas and tail end areas of the second conductors 80 may be arranged on the first conductors 21, and may be connected the head end areas or the tail end areas of the first conductors 21.

It can be understood that the insulating layer 60 has a certain thickness, and the second conductors 80 and the first conductors 21 may not be located in the same plane.

In one embodiment, the plurality of second conductors arranged in parallel and spaced apart along the first direction may be printed on the insulating layer; wherein, the orthographic projection of each of the second conductors on the substrate may be located at two adjacent first conductors, the head end area of the second conductor may overlap the head end area of one of the two adjacent first conductors, and the tail end area of the second conductor may overlap the tail end area of the other one of the two adjacent first conductors.

It can be understandable that the second conductors 80 may be printed on the insulating layer 60, the orthographic projection of the second conductor 80 on the substrate 20 may be located between two adjacent first conductors 21. The head end areas and the tail end areas of the second conductors 80 may overlap the head end areas or the tail end areas of the first conductors 21.

It can be understandable that since the orthographic projection of the second conductor on the substrate is located between two adjacent first conductors, the second conductor 80 may have two adjacent first conductors 21, the head end area of the second conductor 80 may overlap the head end area of one adjacent first conductor 21, and the tail end area of the second conductor 80 may overlap the tail end area of the other adjacent first conductor 21.

In application, an angle of the orthographic projections of the first conductor 21 and the second conductor 80 on the substrate 20 may be any angle.

Specifically, the angle of the orthographic projections of the first conductor 21 and the second conductor 80 on the substrate 20 may be 15 degrees to 45 degrees.

S104, the head end areas of the first conductors and the head end areas of the second conductors may be electrically connected and the tail end areas of the first conductors and the tail end areas of the second conductors may be electrically connected to form an electromagnetic induction coil spirally surrounding the insulating layer.

The insulating layer and the electromagnetic induction coil may constitute an electromagnetic induction unit.

In one embodiment, the second conductors 80 may be thermally cured, that is, the metal ink may be thermally cured, so that the plurality of first conductors and the plurality of second conductors are correspondingly connected to form the electromagnetic induction coil spirally surrounding the insulating layer, that is, the thermally cured second conductors 80 may be connected to the first conductors 21 to form a coil loop.

In one embodiment, a number of first conductors 21 may be N+1, a number of second conductors 80 may be N, wherein N≥1 and is an integer. The head end areas of the first to Nth first conductors 21 may be respectively connected to the head end areas of the first to Nth second conductors 80 in a one-to-one correspondence.

The tail end areas of the second to N+1th first conductors 21 may be respectively connected to the tail end areas of the first to Nth second conductors 80 in a one-to-one correspondence.

It can be understood that after the head end areas of the first to Nth first conductors 21 are respectively connected to the head end areas of the first to Nth second conductors 80 in a one-to-one correspondence, and the tail end areas of the second to N+1th first conductors 21 are respectively connected to the tail end areas of the first to Nth second conductors 80 in a one-to-one correspondence, the first to N+1th first conductors 21 and the first to Nth second conductors 80 may be connected as a loop, that is, the electromagnetic induction coil surrounding the insulating layer 60 may be formed.

It can be understood that the first conductors 21 and the second conductors 80 may be arranged along the first direction, and the electromagnetic induction coil may spirally extend along the first direction.

It can be understood that the electromagnetic induction coil composed of the first conductors 21 and the second conductors 80 may have a multi-circle spiral structure. Since the materials of the first conductors 21 and the second conductors 80 are conductive materials, after the first conductors 21 and the second conductors 80 are connected, the electromagnetic induction coil may form a conductive path. When the electromagnetic induction coil induces a change in the magnetic field, it may generate a current.

In application, lead wires may be set at two ends of the electromagnetic induction coil, and the electromagnetic induction coil may be connected to an external control circuit through the lead wires. The lead wires may be set when printing the first conductors 21, or may be printed when printing the second conductors 80, which is not limited here.

It can be understood that the above electromagnetic induction film may include a plurality of electromagnetic induction units, and the electromagnetic induction units may be arranged on the substrate 20 in parallel and spaced apart.

Figure 10:
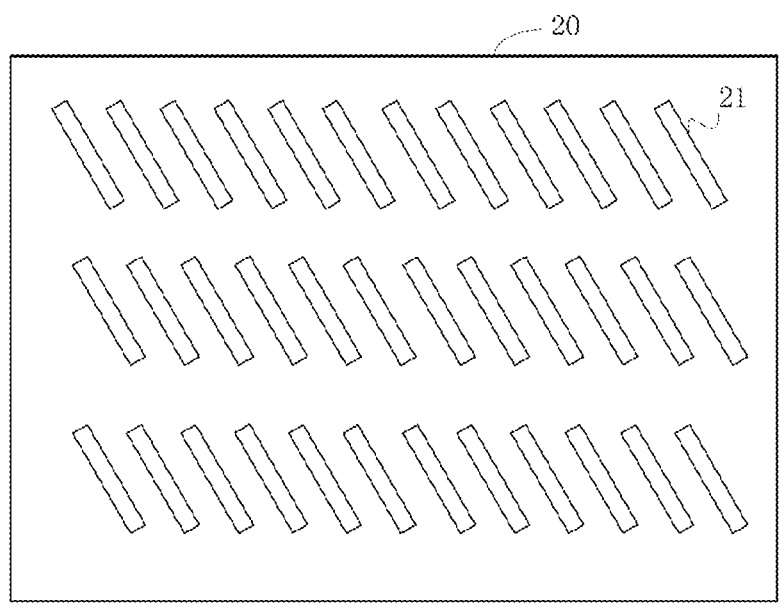
FIG. 10 is a fourth schematic structural diagram of the first conductor provided by an embodiment of the present disclosure.

It can be understood that, as shown in FIG. 10, a plurality of first conductors 21 may be arranged in parallel and spaced apart along the first direction on the substrate 20. The plurality of first conductors 21 arranged in parallel and spaced apart along the first direction may form first conductor groups, and the first conductor groups may be arranged in parallel and spaced apart on the substrate 20. The first conductors 21 arranged on the substrate 20 may not be connected to each other.

It can be understood that the first conductor groups arranged in parallel and spaced apart may be manufactured simultaneously or sequentially.

Figure 11:
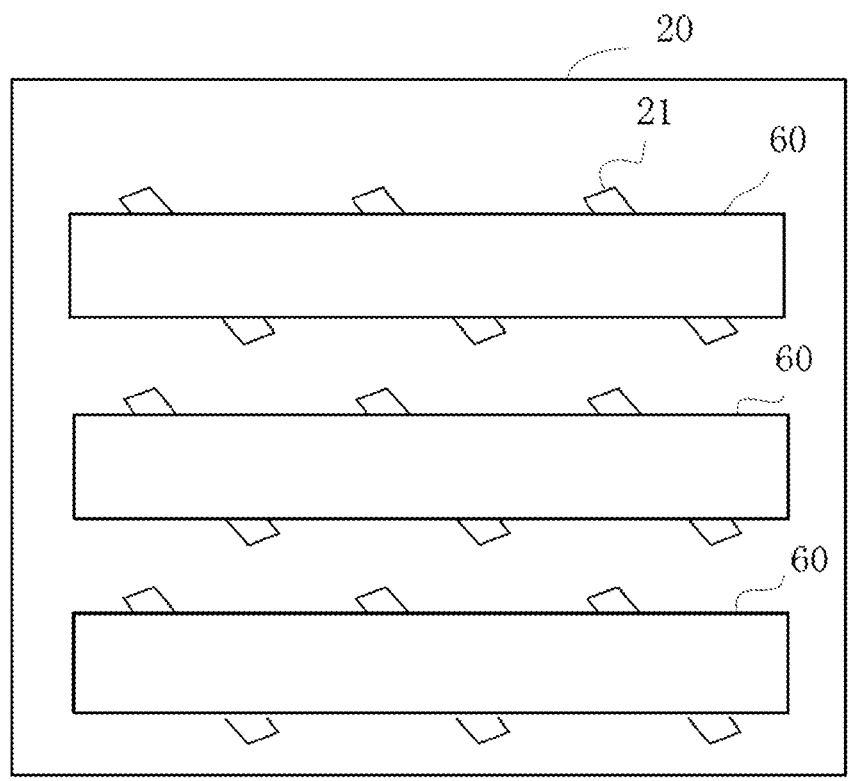
FIG. 11 is a third schematic structural diagram of the insulating layer provided by an embodiment of the present disclosure.

In application, as shown in FIG. 11, S102 may be repeated multiple times to arrange insulating layers 60 on the plurality of first conductors 21, so that the insulating layers 60 may be arranged on the first conductors 21 in parallel and spaced apart.

It can be understood that the insulating layers 60 arranged in parallel and spaced apart may be manufactured simultaneously or sequentially.

Figure 12:
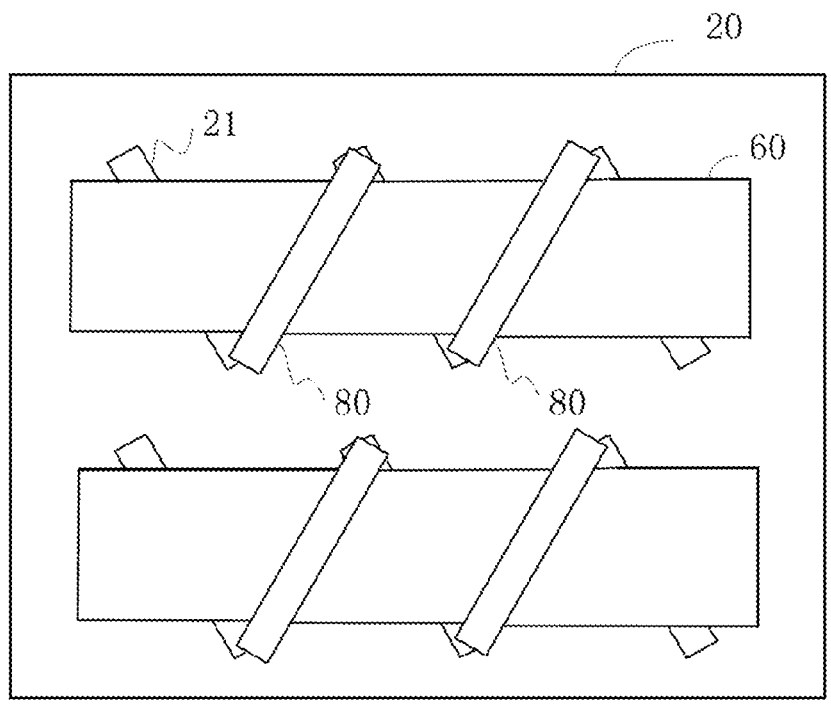
FIG. 12 is a schematic structural diagram of an electromagnetic induction film provided by an embodiment of the present disclosure.

In application, as shown in FIG. 12, S103 may be repeated multiple times to arrange a plurality of second conductors 80 in parallel and spaced apart along the first direction on the insulating layers 60. The plurality of second conductors 80 arranged in parallel and spaced apart along the first direction may form second conductor groups, and the second conductor groups may be arranged in parallel and spaced apart on the substrate 20. The second conductors 80 arranged on the insulating layer 60 may not be connected to each other.

It can be understood that the second conductor groups arranged in parallel and spaced apart may be manufactured simultaneously or sequentially.

It can be understood that S101 to S104 may be performed in sequence. When an electromagnetic induction unit is manufactured, S101 to S104 may be repeated to arrange electromagnetic induction units in parallel and spaced apart.

The embodiments of the present disclosure provide a method for manufacturing an electromagnetic induction film. By arranging a plurality of first conductors in parallel along and spaced apart along a first direction on a substrate; arranging an insulating layer on the plurality of first conductors; arranging a plurality of second conductors in parallel and spaced apart along the first direction on the insulating layer, wherein a head end area and a tail end area of each of the first conductors extend out of the insulating layer, and a head end area and a tail end area of each of the second conductors extend out of the insulating layer; and respectively connecting the plurality of first conductors to the plurality of second conductors to form an electromagnetic induction coil spirally surrounding the insulating layer, an electromagnetic induction loop may be arranged on a same surface of the substrate. Since the head end areas and the tail end areas of the first conductors and the second conductors extend out of the insulating layer, the head end area of one of the first conductors may overlap the head end area of an adjacent one of the second conductors, and the tail end area of the one of the first conductors may overlap the tail end area of the other adjacent one of the second conductors, and thus no process for providing vias is required, and the technical threshold is low, which solves the technical problem that in the prior art, when manufacturing the coil, it is necessary to provide vias through the substrate and fill the vias with metal, the manufacturing processes are complex, and the requirements for processing technology are high.

Embodiment Two

As shown in FIG. 13, this embodiment provides a method for manufacturing an electromagnetic induction panel, including the following steps.

S131, a plurality of first conductors may be arranged in parallel and spaced apart along a first direction on a first substrate; a first insulating layer may be arranged on the plurality of first conductors, wherein a head end area and a tail end area of each of the first conductors may extend out of the first insulating layer; a plurality of second conductors may be arranged in parallel and spaced apart along the first direction on the first insulating layer, wherein a head end area and a tail end area of each of the second conductors may extend out of the first insulating layer; and head end areas of the first conductors and head end areas of the second conductors may be electrically connected and tail end areas of the first conductors and tail end areas of the second conductors may be electrically connected to form an first electromagnetic induction coil spirally surrounding the first insulating layer, so as to obtain a first electromagnetic induction film.

It can be understood that the method for obtaining the first electromagnetic induction film in S131 may be similar to S101-S104, and will not be repeated here.

S132, a plurality of third conductors may be arranged in parallel and spaced apart along a second direction on a second substrate; a second insulating layer may be arranged on the plurality of third conductors, wherein a head end area and a tail end area of each of the third conductors may extend out of the second insulating layer; a plurality of fourth conductors may be arranged in parallel and spaced apart along the second direction on the second insulating layer, wherein a head end area and a tail end area of each of the fourth conductors may extend out of the second insulating layer; and head end areas of the third conductors and head end areas of the fourth conductors may be electrically connected and tail end areas of the third conductors and tail end areas of the fourth conductors may be electrically connected to form an second electromagnetic induction coil spirally surrounding the second insulating layer, so as to obtain a second electromagnetic induction film.

It can be understood that the method for obtaining the second electromagnetic induction film in S132 may be similar to S101-S104, and will not be repeated here.

S133, the first electromagnetic induction film and the second electromagnetic induction film may be bonded.

In application, the first electromagnetic induction film and the second electromagnetic induction film may be bonded by glues, for example, optically clear adhesives (OCA).

S134, the bonded first electromagnetic induction film and second electromagnetic induction film may be bonded to a glass cover plate to obtain the electromagnetic induction panel.

In application, the first electromagnetic induction film and the second electromagnetic induction film and the glass cover plate may be bonded by glues, for example, optically clear adhesives.

Optionally, the first direction and the second direction may be different directions, the first conductors on the first substrate may be interlaced with the third conductors on the second substrate, and the second conductor on the first substrate may be interlaced with the fourth conductors on the second substrate.

It can be understood that when the first electromagnetic induction film is bonded to the second electromagnetic induction film, the first electromagnetic induction coil and the second electromagnetic induction coil are interlaced, that is, they are not in parallel. In this embodiment, the first electromagnetic induction coil and the second electromagnetic induction coil are perpendicular to each other, that is, the first electromagnetic induction unit and the second electromagnetic induction unit are perpendicular to each other.

It can be understood that the first electromagnetic induction film and the second electromagnetic induction film may be the same electromagnetic induction film, and the second electromagnetic induction film may be rotated when manufacturing the electromagnetic induction panel, so that the first electromagnetic induction coil and the second electromagnetic induction coil may form a certain angle.

In application, the electromagnetic induction coils on the two electromagnetic induction films may be insulated from each other, and the substrate 20 of one electromagnetic induction film may be arranged on the second conductors 80 of the other electromagnetic induction film.

In application, the electromagnetic induction films and the glass cover plate may be bonded by glues, for example, optically clear adhesives.

Embodiment Three

As shown in FIG. 8, in this embodiment, an electromagnetic induction film is provided, which includes a substrate and a plurality of electromagnetic induction units; wherein each of the electromagnetic induction units may include a plurality of first conductors 21, an insulating layer 60, and a plurality of second conductors 80 in sequence, the plurality of first conductors 21 may be arranged in parallel and spaced apart along a first direction on the substrate 20, the plurality of second conductors 80 may be arranged in parallel and spaced apart along the first direction on the insulating layer 60, a head end area and a tail end area of each of the first conductors 21 may extend out of the insulating layer 60, a head end area and a tail end area of each of the second conductors 80 may extend out of the insulating layer 60, and head end areas of the first conductors 21 and head end areas of the second conductors 80 may be electrically connected and tail end areas of the first conductors and tail end areas of the second conductors may be electrically connected to form an electromagnetic induction coil spirally surrounding the insulating layer.

In application, the substrate 20 may be transparent materials, such as a polyethylene terephthalate film, a polyimide film, or a cyclic olefin polymer film, etc.

In application, the first conductor 21 may be transparent conductive materials, such as nano indium tin oxides and conductive glasses, or a metal material, such as nano silver wires or metal grids. When the first conductor 21 is made of metal, the width of the first conductor 21 may be smaller than a preset size, and the preset size may be adjusted according to actual conditions. In this embodiment, the preset size may be 100 µm as an example, and when the first conductor 21 is made of metal and the width is less than 100 µm, the first conductors 21 cannot be easily observed by human eyes.

In application, the insulating layer 60 may include materials of a transparent insulating ink, such as a UA curing insulating ink.

In application, the second conductor 80 may include materials of a metallic ink, such as a silver glue and a copper glue. The width of the second conductor 80 may be smaller than a preset size, and the preset size may be adjusted according to actual conditions. In this embodiment, the preset size may be 100 μm as an example, and when the width of the second conductor 80 is less than 100 μm, the second conductor 80 cannot be easily observed by human eyes.

It can be understood that when the first conductor 21 is a transparent material or a metal wire with a width smaller than the preset size, the insulating layer 60 is a transparent material, and the second conductor 80 is a metal wire with a width smaller than the preset size, the electromagnetic induction unit may be approximately transparent, and cannot be easily observed by human eyes.

It can be understood that the electromagnetic induction units arranged on the substrate 20 may be difficult to be observed by human eyes, and the substrate 20 may be made of a transparent material, so the electromagnetic induction film may be approximately transparent.

In the prior art, the electromagnetic induction film may include first conductors arranged on one side of a substrate and second conductors arranged on the other side of the substrate. Vias may be provided through the substrate, and the vias may be filled with conductive materials. The first conductors may be electrically connected to the second conductors through the vias. However, the technical requirements for providing the vias through the substrate and filling the vias with conductive materials may be high and complex.

In addition, the materials used in the traditional electromagnetic induction film may not be highly transparent, and may be generally set at the back side of the display screen. When the electromagnetic pen is used for touch, the display screen may interfere with the induced magnetic field, resulting in the problem of insensitive touch sensing.

In this embodiment, the first conductors and the second conductors may be arranged on the same surface of the substrate. Since the head end areas and the tail end areas of each of the first conductors extend out of the insulating layer and the head end areas and the tail end areas of each of the second conductors extend out of the insulating layer, the head end area of one of the first conductors may overlap the head end area of an adjacent one of the second conductors, and the tail end area of the one of the first conductors may overlap the tail end area of the other adjacent one of the second conductors, and thus no process for providing vias is required, and the technical threshold is low, which solves the problem of high technical requirements and complex production of traditional electromagnetic induction films.

Further, by using a transparent substrate, using first conductors made of transparent conductive materials or metal wires with a width smaller than a preset size, using an insulating layer made of transparent insulating materials, and using second conductors made of metal wires with a width smaller than the preset size, the electromagnetic induction film composed of the substrate, the first conductors, the insulating layer and the second conductors may be approximately transparent. An electromagnetic induction plate may be obtained by bonding two electromagnetic induction films perpendicular to each other and bonding the bonded two electromagnetic induction films to a glass cover plate. The electromagnetic induction panel may also be approximately transparent. When the electromagnetic induction film in this embodiment is used to make a touch screen, the electromagnetic induction film in this embodiment may be placed on a front side of the display screen (i.e., a top surface of the display screen). A user may view contents on the display screen through the electromagnetic induction film, and the electromagnetic induction film may have a low visual impact on the user. When using an electromagnetic pen to touch, compared with the electromagnetic induction panel disposed on the back side of the display screen in the prior art, it may reduce the interference of the display screen to the magnetic field, which makes the touch screen more sensitive to the magnetic field.

Embodiment Four

Figure 14:
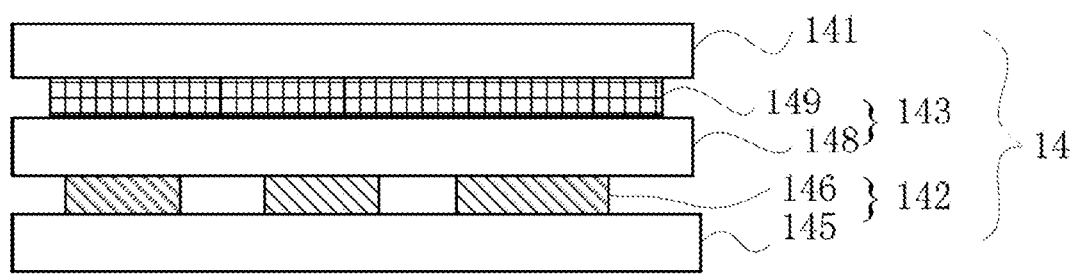
FIG. 14 is a schematic structural diagram of an electromagnetic induction panel provided by an embodiment of the present disclosure.

As shown in FIG. 14, in this embodiment, an electromagnetic induction panel 14 is provided, which includes a glass cover plate 141, a first electromagnetic induction film 142 and a second electromagnetic induction film 143 in sequence, wherein the first electromagnetic induction film 142 may include a first substrate 145 and a plurality of first electromagnetic induction units 146, the second electromagnetic induction film 143 may include a second substrate 148 and a plurality of second electromagnetic induction units 149. The first electromagnetic induction film 142 and the second electromagnetic induction film 143 may be manufactured by the corresponding manufacturing method described above.

Each of the first electromagnetic induction units 146 may include a plurality of first conductors, a first insulating layer, and a plurality of second conductors in sequence, the plurality of first conductors may be arranged in parallel and spaced apart along a first direction on the first substrate 145, the plurality of second conductors may be arranged in parallel and spaced apart along the first direction on the first insulating layer, a head end area and a tail end area of each of the first conductors may extend out of the first insulating layer, a head end area and a tail end area of each of the second conductors may extend out of the first insulating layer, and head end areas of the first conductors and head end areas of the second conductors may be electrically connected and tail end areas of the first conductors and tail end areas of the second conductors may be electrically connected to form an first electromagnetic induction coil spirally surrounding the first insulating layer.

Each of the second electromagnetic induction units 149 may include a plurality of third conductors, a second insulating layer, and a plurality of fourth conductors in sequence, the plurality of third conductors may be arranged in parallel and spaced apart along a second direction on the second substrate 148, the plurality of fourth conductors may be arranged in parallel and spaced apart along the second direction on the second insulating layer, a head end area and a tail end area of each of the third conductors may extend out of the second insulating layer, a head end area and a tail end area of each of the fourth conductors may extend out of the second insulating layer, and head end areas of the third conductors and head end areas of the fourth conductors may be electrically connected and tail end areas of the third conductors and tail end areas of the fourth conductors may be electrically connected to form an second electromagnetic induction coil spirally surrounding the second insulating layer, wherein an orthographic projection of the second electromagnetic induction coil on the first substrate 145 may intersect the first electromagnetic induction coil.

It can be understood that the basic structures of the first electromagnetic induction film 142 and the second electromagnetic induction film 143 may be similar to that of the electromagnetic induction film described in the embodiment three, and will not be repeated here.

In one embodiment, the first electromagnetic induction film 142 and the second electromagnetic induction film 143 of the embodiment two may be bonded to each other.

It can be understood that the first direction and the second direction may be different directions.

It can be understood that the orthographic projection of the second electromagnetic induction coil on the first substrate 145 may intersect the first electromagnetic induction coil. In this embodiment, the orthographic projection of the second electromagnetic induction coil on the first substrate 145 may be perpendicular to the first electromagnetic induction coil.

In application, the first electromagnetic induction film 142, the second electromagnetic induction film 143 and the glass cover plate 141 may be bonded by transparent glues, for example, optically clear adhesives.

In application, the second electromagnetic induction film 143 may be obtained by rotating the first electromagnetic induction film 142.

In application, the substrates of the first electromagnetic induction film 142 and the second electromagnetic induction film 143 may be made of transparent materials, such as a polyethylene terephthalate film, a polyimide film, or a cyclic olefin polymer film, etc.

In application, the first conductors of the first electromagnetic induction film 142 and the second electromagnetic induction film 143 may be nano indium tin oxides, nano silver wires or metal grids.

In application, the insulating layers of the first electromagnetic induction film 142 and the second electromagnetic induction film 143 may be transparent insulating ink layers.

In application, the second conductors of the first electromagnetic induction film 142 and the second electromagnetic induction film 143 may be metallic ink conductors.

In application, when the first electromagnetic induction film 142 and the second electromagnetic induction film 143 are bonded together, the first electromagnetic induction units 146 and the second electromagnetic induction units 149 may be insulated from each other. Specifically, the substrate of one electromagnetic induction film may be disposed on the second conductors of the other electromagnetic induction film.

In one embodiment, the bonded first electromagnetic induction film 142 and second electromagnetic induction film 143 may be bonded to the glass cover plate 141 to obtain the electromagnetic induction panel.

In application, the electromagnetic induction film and the glass cover plate 141 may be bonded by transparent glues, for example, optically clear adhesives.

It can be understood that the electromagnetic induction film may be approximately transparent, the glass cover plate may be a transparent glass cover plate, and the optically clear adhesives used for bonding may be transparent glues. Therefore, the electromagnetic induction panel composed of two electromagnetic induction films and the glass cover plate may be approximately transparent.

Since the electromagnetic induction panel in this embodiment is approximately transparent, the electromagnetic induction panel in this embodiment may be placed on a front side of the display screen. A user may view contents on the display screen through the electromagnetic induction film, and the electromagnetic induction film may have a low visual impact on the user. When using an electromagnetic pen to touch, compared with the electromagnetic induction panel disposed on the back side of the display screen in the prior art, it may reduce the interference of the display screen to the magnetic field, which makes the touch screen more sensitive to the magnetic field.

Embodiment Five

Figure 15:
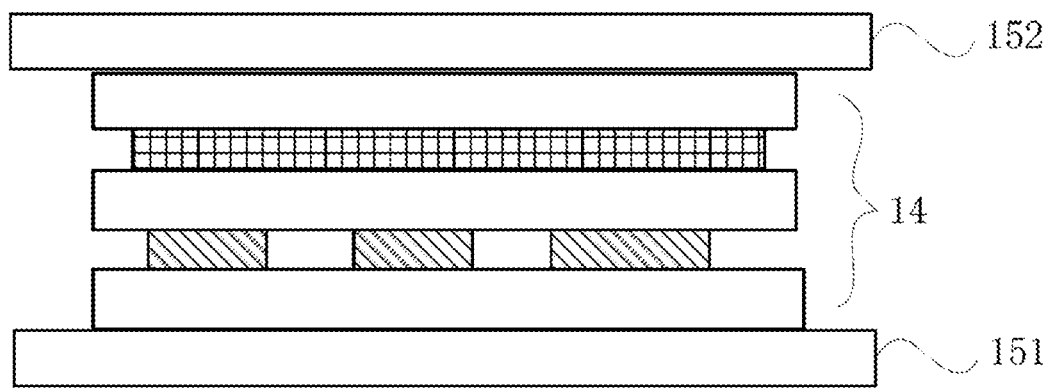
FIG. 15 is a schematic structural diagram of a touch display device provided by an embodiment of the present disclosure.

As shown in FIG. 15, in this embodiment, a touch display device is provided, which includes a display screen 151 and the electromagnetic induction panel 14 described in the embodiment four, wherein the electromagnetic induction panel may be arranged at a front end of the display screen.

Optionally, the display screen may be a liquid crystal display screen.

Optionally, the touch display device may further include a glass panel 152, the glass panel 152 may be arranged at the front end of the display screen, and the electromagnetic induction panel 14 may be arranged between the glass panel 152 and the display screen 151.

In application, the electromagnetic induction panel 14 and the front end of the display screen 151 may be bonded by optically clear adhesives, and the electromagnetic induction panel 14 and the glass panel 152 may be bonded by optically clear adhesives.

It can be understood that the touch display device may further include more components or some components may be combined, and the touch display device is not limited to this embodiment.

In this embodiment, it is difficult for human eyes to perceive the existence of the first electromagnetic induction units and the second electromagnetic induction units on the electromagnetic induction panel. Therefore, the electromagnetic induction panel may be approximately transparent. When the electromagnetic induction panel is arranged at the front end of the display screen, it hardly affects the display of the display screen. The human eyes may watch the contents on the display screen through the electromagnetic induction panel. The electromagnetic induction pen may directly contact the electromagnetic induction panel, which can effectively reduce the interference of the display screen to the touch signal, so that the detection of the changes of induced magnetic field may be better, and the sensitivity and accuracy of the touch display device may be improved.

In the above-mentioned embodiments, the description of each embodiment has its own focus. For parts that are not detailed or recorded in an embodiment, reference may be made to related descriptions of other embodiments.

The above descriptions are only preferred embodiments of the present disclosure, and are not intended to limit the present disclosure. Any modification, equivalent replacement and improvement made within the principle of the present disclosure shall be included in the protection scope of the present disclosure.

What is claimed is:

1. A method for manufacturing an electromagnetic induction film, comprising:
    arranging a plurality of first conductors in parallel and spaced apart along a first direction on a substrate;
    arranging an insulating layer on the plurality of first conductors, wherein a head end area and a tail end area of each of the first conductors extend out of the insulating layer;
    arranging a plurality of second conductors in parallel and spaced apart along the first direction on the insulating layer, wherein a head end area and a tail end area of each of the second conductors extend out of the insulating layer; and electrically connecting head end areas of the first conductors to head end areas of the second conductors, and electrically connecting tail end areas of the first conductors to tail end areas of the second conductors, to form an electromagnetic induction coil spirally surrounding the insulating layer.

2. The method according to claim 1, wherein arranging the plurality of first conductors in parallel and spaced apart on the substrate comprises:

arranging a first thin film on the substrate; and removing a grid area of the first thin film to obtain the plurality of first conductors arranged in parallel and spaced apart on the substrate; wherein a distance between adjacent grids in the grid area in the first direction is equal to a distance between two adjacent first conductors of the plurality of first conductors.

3. The method according to claim 1, wherein arranging the insulating layer on the plurality of first conductors comprises:

printing the insulating layer on middle areas of the plurality of first conductors; wherein a length of the insulating layer in the first direction is greater than a length of the plurality of first conductors in the first direction.

4. The method according to claim 3, wherein printing the insulating layer on the middle areas of the plurality of first conductors comprises:

printing a layer of insulating ink on the middle areas of the plurality of first conductors; and curing the insulating ink to obtain the insulating layer.

5. The method according to claim 1, wherein arranging the plurality of second conductors in parallel and spaced apart along the first direction on the insulating layer comprises:

printing a layer of metallic ink on the insulating layer to obtain the plurality of second conductors arranged in parallel and spaced apart along the first direction; wherein a orthographic projection of each of the second conductors on the substrate is located between two adjacent first conductors of the plurality of first conductors, the head end area of each of the second conductors overlaps the head end area of one of the two adjacent first conductors, and the tail end area of each of the second conductors overlaps the tail end area of the other one of the two adjacent first conductors.

6. The method according to claim 5, wherein electrically connecting the head end areas of the first conductors to the head end areas of the second conductors, and electrically connecting the tail end areas of the first conductors to the tail end areas of the second conductors, to form the electromagnetic induction coil spirally surrounding the insulating layer comprises:

thermally curing the metallic ink, electrically connecting the head end area of each of the second conductors to the head end area of one of the two adjacent first conductors, and electrically connecting the tail end area of each of the second conductors to the tail end area of the other one of the two adjacent first conductors, so as to form the electromagnetic induction coil spirally surrounding the insulating layer.

7. A method for manufacturing an electromagnetic induction panel, comprising:

arranging a plurality of first conductors in parallel and spaced apart along a first direction on a first substrate; arranging a first insulating layer on the plurality of first conductors, wherein a head end area and a tail end area of each of the first conductors extend out of the first insulating layer; arranging a plurality of second conductors in parallel and spaced apart along the first direction on the first insulating layer, wherein a head end area and a tail end area of each of the second conductors extend out of the first insulating layer; electrically connecting head end areas of the first conductors to head end areas of the second conductors and electrically connecting tail end areas of the first conductors to tail end areas of the second conductors to form an first electromagnetic induction coil spirally surrounding the first insulating layer, so as to obtain a first electromagnetic induction film;

arranging a plurality of third conductors in parallel and spaced apart along a second direction on a second substrate; arranging a second insulating layer on the plurality of third conductors, wherein a head end area and a tail end area of each of the third conductors extend out of the second insulating layer; arranging a plurality of fourth conductors in parallel and spaced apart along the second direction on the second insulating layer, wherein a head end area and a tail end area of each of the fourth conductors extend out of the second insulating layer; and electrically connecting head end areas of the third conductors to head end areas of the fourth conductors and electrically connecting tail end areas of the third conductors to tail end areas of the fourth conductors to form an second electromagnetic induction coil spirally surrounding the second insulating layer, so as to obtain a second electromagnetic induction film;

bonding the first electromagnetic induction film and the second electromagnetic induction film; and bonding the bonded first electromagnetic induction film and second electromagnetic induction film to a glass cover plate to obtain the electromagnetic induction panel.

8. An electromagnetic induction film manufactured by the method according to claim 1, comprising a substrate and a plurality of electromagnetic induction units;

wherein each of the electromagnetic induction units comprises a plurality of first conductors, an insulating layer, and a plurality of second conductors in sequence, the plurality of first conductors are arranged in parallel and spaced apart along a first direction on the substrate, the plurality of second conductors are arranged in parallel and spaced apart along the first direction on the insulating layer, a head end area and a tail end area of each of the first conductors extend out of the insulating layer, a head end area and a tail end area of each of the second conductors extend out of the insulating layer, and head end areas of the first conductors and head end areas of the second conductors are electrically connected and tail end areas of the first conductors and tail end areas of the second conductors are electrically connected to form an electromagnetic induction coil spirally surrounding the insulating layer.

* * * * *